(12) United States Patent
König et al.

(10) Patent No.: US 12,021,351 B2
(45) Date of Patent: Jun. 25, 2024

(54) DIODE LASER AND METHOD FOR OPERATING A DIODE LASER

(71) Applicant: OSRAM Opto Semiconductors GmbH, Regensburg (DE)

(72) Inventors: Harald König, Bernhardswald (DE); Bernhard Stojetz, Wiesent (DE); Alfred Lell, Maxhütte-Haidhof (DE); Muhammad Ali, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 584 days.

(21) Appl. No.: 17/292,197

(22) PCT Filed: Nov. 7, 2019

(86) PCT No.: PCT/EP2019/080575
§ 371 (c)(1),
(2) Date: May 7, 2021

(87) PCT Pub. No.: WO2020/094803
PCT Pub. Date: May 14, 2020

(65) Prior Publication Data
US 2021/0391695 A1 Dec. 16, 2021

(30) Foreign Application Priority Data
Nov. 8, 2018 (DE) .................... 102018127977.9

(51) Int. Cl.
*H01S 5/40* (2006.01)
*H01S 5/024* (2006.01)
*H01S 5/343* (2006.01)
(52) U.S. Cl.
CPC ........ *H01S 5/4031* (2013.01); *H01S 5/02407* (2013.01); *H01S 5/34346* (2013.01)

(58) Field of Classification Search
CPC .............. H01S 5/4031; H01S 5/02407; H01S 5/34346; H01S 5/04254; H01S 5/04252; H01S 5/04256
(Continued)

(56) References Cited

U.S. PATENT DOCUMENTS 4,577,321 A * 3/1986 Carney .................. B82Y 20/00
372/50.12
5,208,823 A   5/1993 Patel
(Continued)

FOREIGN PATENT DOCUMENTS

DE   3534744 A1   4/1987
GB   2501509 A    4/1987
(Continued)

OTHER PUBLICATIONS

Sze et al., "Physics of Semiconductor Devices", Physics of Semiconductor Devices, 3rd Edition, 2007, 1 page.
(Continued)

*Primary Examiner* — Vu A Vu
(74) *Attorney, Agent, or Firm* — MH2 TECHNOLOGY LAW GROUP LLP

(57) ABSTRACT

The diode laser comprises a laser bar having a semiconductor body and an active layer, wherein the laser bar has a plurality of individual emitters. At least some individual emitters are respectively assigned a section of the semiconductor body and a current regulating element connected in series therewith, such that, during operation of the individual emitters as intended, an electrical operating current $I_0$ fed to the individual emitter in each case flows completely through the assigned section of the semiconductor body and in the process a voltage drop $U_H$ occurs at the section and at least part of said operating current $I_0$ flows through the assigned current regulating element and experiences an electrical (Continued)

resistance $R_S$ in the process. In the case of the individual emitters, the current regulating element assigned in each case is configured such that the resistance Rg at an operating temperature $T_0$ has a positive temperature coefficient $dR_S/dT|_{T0}$. Alternatively or additionally, the resistance $R_S$ is greater than $|\Delta U_H/I_0|$, wherein $\Delta U_H$ is the change in the voltage drop $U_H$ at the assigned section of the semiconductor body in the event of an increase in the temperature T of the individual emitter from an operating temperature $T_0$ by 1 K.

19 Claims, 7 Drawing Sheets

(58) Field of Classification Search
 USPC ....................................................... 372/43.01
 See application file for complete search history.

(56) References Cited

U.S. PATENT DOCUMENTS

| | | | | |
|---|---|---|---|---|
| 6,215,804 B1* | 4/2001 | Sahlen | ................. | H01S 5/4031 |
| | | | | 372/8 |
| 6,351,481 B1* | 2/2002 | Marcomber | .......... | H01S 5/0042 |
| | | | | 372/50.1 |
| 6,377,599 B1* | 4/2002 | Marshall | ................ | G02B 27/40 |
| | | | | 359/833 |
| 6,628,686 B1* | 9/2003 | Sargent | ................. | B82Y 20/00 |
| | | | | 372/46.01 |
| 8,488,245 B1* | 7/2013 | Chann | .................. | H01S 5/4031 |
| | | | | 353/34 |
| 8,861,082 B2* | 10/2014 | Cobb | ................ | G02B 19/0052 |
| | | | | 359/489.08 |
| 8,942,521 B2* | 1/2015 | Song | ........................ | G02B 6/32 |
| | | | | 385/24 |
| 9,455,552 B1* | 9/2016 | Price | ...................... | H01S 5/4075 |
| 10,833,482 B2* | 11/2020 | Chen | ................. | G02B 19/0057 |
| 11,437,780 B2* | 9/2022 | Ikedo | ........................ | H01S 5/20 |
| 2015/0236472 A1 | 8/2015 | Ide et al. | | |
| 2015/0263483 A1 | 9/2015 | Firth | | |

FOREIGN PATENT DOCUMENTS

| | | |
|---|---|---|
| JP | H6120577 | 4/1994 |
| JP | H07015068 A | 1/1995 |
| JP | H9320811 | 12/1997 |
| JP | 2000127466 | 5/2000 |
| JP | 2004356334 A | 12/2004 |
| JP | 200551238 | 2/2005 |
| JP | 2005310849 A1 | 11/2005 |
| JP | 2006128236 | 5/2006 |
| JP | 2009105240 | 5/2009 |
| JP | 2011162438 | 8/2011 |
| JP | 201259898 | 3/2012 |
| JP | 2012212927 A | 11/2012 |
| JP | 2013046037 A | 3/2013 |
| JP | 2013055186 A | 3/2013 |
| JP | 201493463 | 5/2014 |
| JP | 2015532538 A | 11/2015 |
| JP | 201649755 | 4/2016 |
| JP | 2017208544 | 11/2017 |
| WO | 2019042827 A1 | 3/2019 |

OTHER PUBLICATIONS

"Thermische Effekte: Temperatursensoren", University of Applied Sciences Jena, https://studylibde.com/doc/3060937/thermische-effekte--temperatursensoren, Accessed on Nov. 30, 2017, 51 pages.
International Search Report and Written Opinion in corresponding International Application No. PCT/EP2019/080575 mailed on Jun. 26, 2020, 22 pages.
Ozawa, Takayoshi, Decision to Grant issued in Japanese Patent Application No. 2021-523250 on Mar. 7, 2023, 5 pages, with English language translation.
Brüninghoff, Stefanie et al., "Temperature dependence of blue InGaN lasers", SPIE OPTO: Integrated Optoelectronic Devices, 2009, 8 pages.
Ozawa, Takayosi (JP Examiner), Japanese Notice of Reasons for Rejection for Japanese Application No. 2021-523250 mailed on Apr. 26, 2022, 14 pages.

* cited by examiner

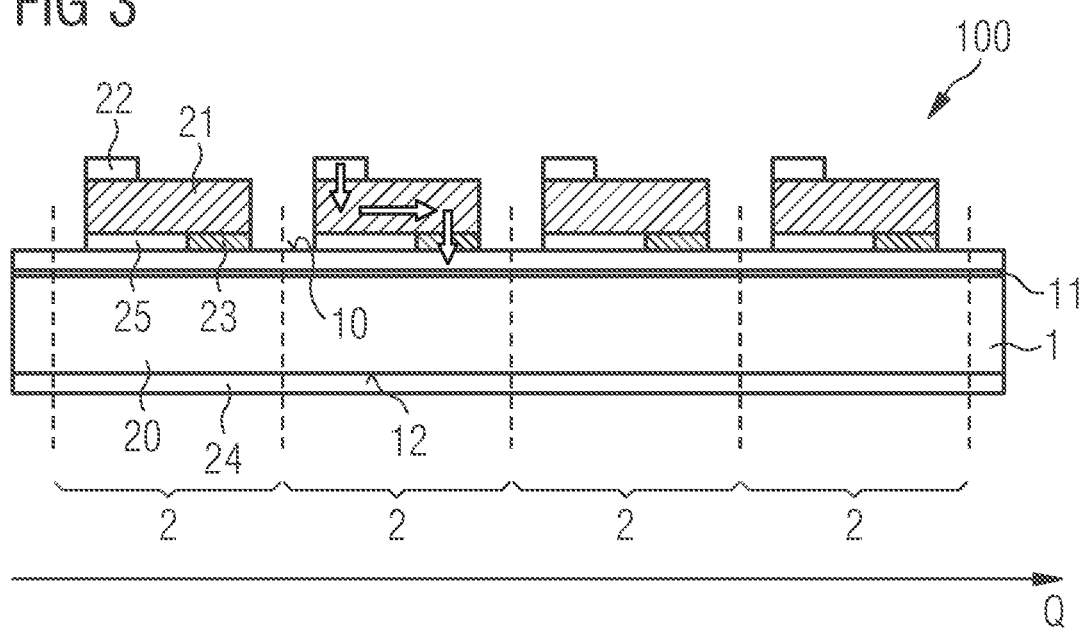
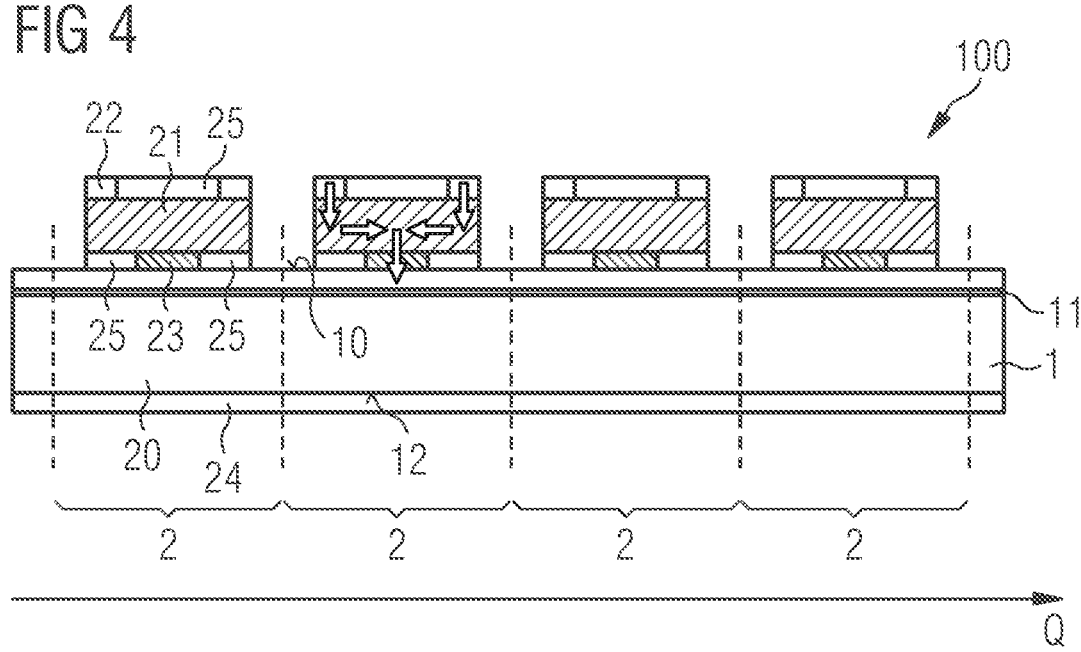

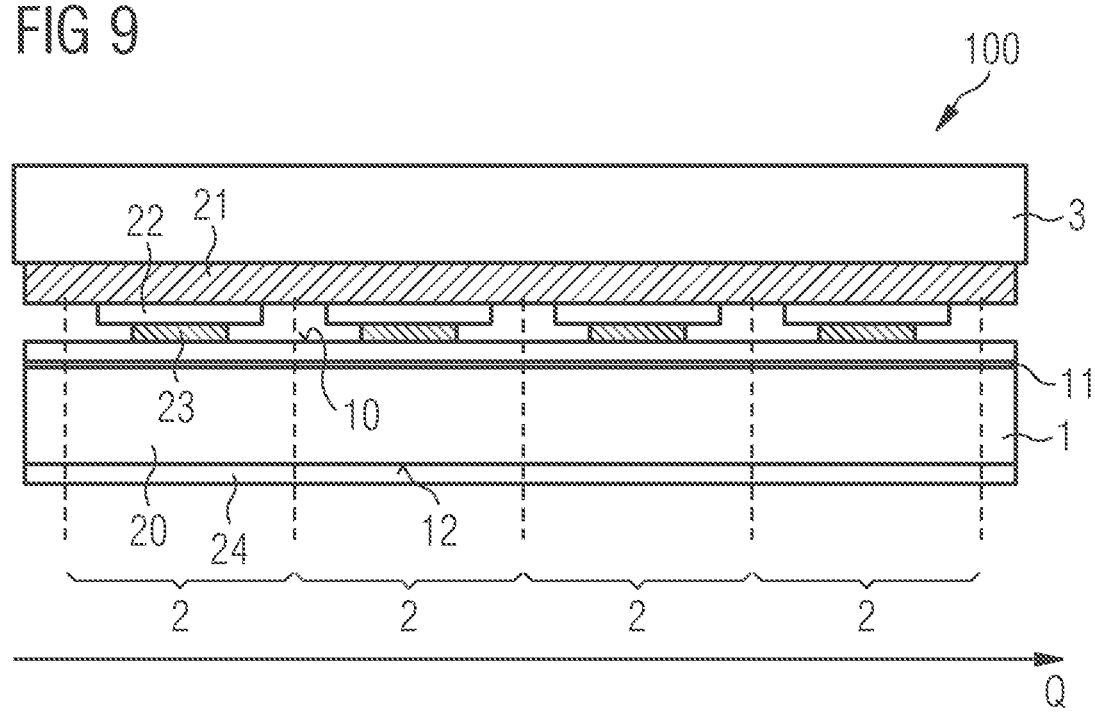
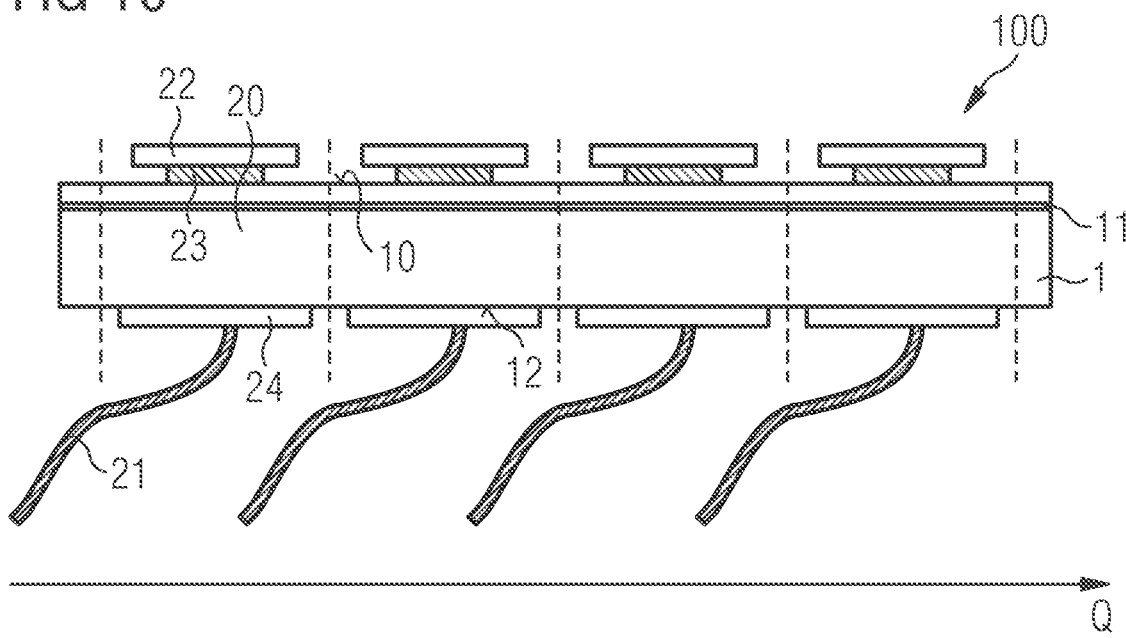

DIODE LASER AND METHOD FOR OPERATING A DIODE LASER

CROSS-REFERENCE TO RELATED APPLICATIONS

This patent application is a national stage entry from International Application No. PCT/EP2019/080575, filed on Nov. 7, 2019, published as International Publication No. WO 2020/094803 A1 on May 14, 2020, and claims priority under 35 U.S.C. § 119 from German patent application 10 2018 127 977.9, filed Nov. 8, 2018, the entire contents of all of which are incorporated by reference herein.

FIELD

A diode laser is specified. Furthermore, a method for operating a diode laser is specified.

BACKGROUND

A task to be solved is to specify a diode laser with a low failure rate. Another task to be solved is to specify a method for operating such a diode laser.

SUMMARY

First, a diode laser is specified.

According to at least one embodiment, the diode laser comprises a laser bar, wherein the laser bar comprises a semiconductor body having an active layer for generating laser radiation. Further, the laser bar comprises a plurality of individual emitters arranged side by side in a transverse direction, each of which emits laser radiation during intended operation.

The laser bar is in particular an edge-emitting laser bar. A laser bar is understood here and in the following to be a separately manageable element that can be contacted electrically. A laser bar is created by separation from a wafer composite. A laser bar preferably comprises exactly one originally contiguous region of the semiconductor body grown in the wafer composite. The semiconductor body of the laser bar is preferably formed contiguously. The active layer of the laser bar can be formed contiguously, in particular simply connected, or segmented. The lateral extent of the laser bar, measured parallel to a main extension plane of the semiconductor body or parallel to the active layer, is, for example, at most 5% or at most 20% greater than the lateral extent of the semiconductor body. In particular, the laser bar is a semiconductor chip.

For example, the semiconductor body of the laser bar is based on a III-V compound semiconductor material. In particular, the semiconductor body comprises a layer sequence of layers of such semiconductor material grown epitaxially on top of each other, for example. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, wherein $0 \leq n \leq 1$, $0 \leq m \leq 1$, and $m+n \leq 1$, respectively. Here, the semiconductor body may comprise dopants as well as additional components. For simplicity, however, only the essential constituents of the crystal lattice of the semiconductor body, i.e. Al, As, Ga, In, N or P, are specified, even if these may be partially replaced and/or supplemented by small amounts of additional substances. Preferably, the semiconductor body is based on AlInGaN.

The active layer of the semiconductor body includes in particular at least one pn junction and/or at least one quantum well structure in the form of a single quantum well, SQW for short, or in the form of a multi-quantum well structure, MQW for short.

The active layer can generate electromagnetic radiation in the blue or green or red spectral range or in the UV range or in the IR range during intended operation. In particular, the active layer is arranged between an n-doped region and a p-doped region of the semiconductor body. The p-doped region lies between a first main surface of the semiconductor body and the active layer, and the n-doped region lies between a second main surface of the semiconductor body and the active layer. The first and second main surfaces face each other and form top surfaces of the semiconductor body. The first main surface will also be referred to as the p-side and the second main surface as the n-side in the following.

The individual emitters of the laser bar may be individually and independently operable. The individual emitters are transversely juxtaposed, for example spaced apart, regions of the laser bar in which laser radiation is generated during operation. Each individual emitter comprises a partial region or section of the semiconductor body. The width of an individual emitter, measured along the transverse direction, is defined, for example, by the region of the active layer in which laser radiation is generated during intended operation of the individual emitter. Individual emitters are also referred to as laser diodes.

In the intended operation of the diode laser, the individual emitters are, for example, driven simultaneously and in parallel. Preferably, the individual emitters then all generate laser radiation simultaneously, which is coupled out of the laser bar along a longitudinal direction. For this purpose, the laser bar preferably comprises two facets opposite each other in the longitudinal direction, which form the mirrors of a resonator.

The transverse direction is a direction parallel to a main extension plane of the active layer or the semiconductor body. The longitudinal direction is a direction parallel to the same main extension plane and perpendicular to the transverse direction.

According to at least one embodiment, the diode laser comprises one or more current control elements on the semiconductor body. In particular, the diode laser may comprise exactly one current control element or a plurality of current control elements on the semiconductor body. The current control element or elements are in particular electrical resistors. Specifications made below for one current control element may apply accordingly to several or all current control elements.

The current control element is, for example, a contiguous, in particular simply connected, element. The current control element can be of one-piece or monolithic design. That is, all regions of the current control element are integrally formed with each other and contain the same material or are made of the same material.

The current control element is arranged on the semiconductor body. That is, the current control element is formed outside the semiconductor body. The current control element may be arranged directly on the semiconductor body or indirectly on the semiconductor body. In particular, the current control element is arranged on a main side of the semiconductor body. The current control element may be arranged on the p-side or on the n-side of the semiconductor body. Preferably, the current control element is mechanically fixed and permanently connected to the semiconductor body. A distance between the current control element and the semiconductor body is, for example, at most 50 µm or at most 10 µm or at most 5 µm.

According to at least one embodiment, at least some individual emitters, in particular all individual emitters, are each assigned a section of the semiconductor body and a current control element connected in series therewith, so that in the intended operation of the individual emitters an operating current $I_0$ supplied to the individual emitter in each case flows completely through the assigned section of the semiconductor body and in the process experiences a voltage drop $U_H$ at this section. At least part of this operating current $I_0$, preferably the entire operating current $I_0$, flows through the associated current control element and experiences an electrical resistance $R_S$ in the process.

The individual emitters can each be uniquely assigned their own current control element. However, the same current control element can also be assigned to several or all individual emitters.

According to at least one embodiment, the respective current control element assigned to the individual emitters is configured such that the resistance $R_S$ comprises a positive temperature coefficient $dR_S/dT|_{T_0}$ at an operating temperature $T_0$. Alternatively or additionally, the resistance $R_S$ is greater than $|\Delta U_H/I_0|$, wherein $\Delta U_H$ is the change in the voltage drop $U_H$ at the section of the semiconductor body associated with the individual emitter when the temperature T of the individual emitter is increased from an operating temperature $T_0$ by 1 K. $dR_S/dT|_{T_0}$ and $|\Delta U_H/I_0|$ are specified in each case for the case of a constant operating current $I_0$.

The temperature coefficient $dR_S/dT|_{T_0}$ is defined as the derivative of the resistance $R_S$ with respect to the temperature T, evaluated at the operating temperature $T_0$. The symbol $|_{T_0}$ means that the derivative is evaluated at the operating temperature $T_0$. Preferably, the resistor $R_S$ comprises a positive temperature coefficient anywhere in a range of at least 10 K or at least 20 K or at least 50 K around the operating temperature $T_0$.

The intended operation of an individual emitter is an operation with an operating current $I_0$ and an operating temperature $T_0$. The individual emitters can be operated with direct current or pulsed. For example, the operating current $I_0$ may have any value between 1 mA and 100 A inclusive, for example between 0.5 A and 5 A inclusive, preferably between 1.5 A and 2.5 A inclusive. The operating temperature $T_0$ is the temperature of an individual emitter in the region of the associated section of the semiconductor body. For example, the operating temperature $T_0$ of an individual emitter may have any value between 273 K and 500 K, preferably between 330 K and 470 K, inclusive. For example, the intended operation of each of the individual emitters is operation with an operating current $I_0$ of 1.5 A or 2 A or 2.5 A and with an operating temperature $I_0$ of 330 K or 400 K or 450 K.

If the temperature of an individual emitter increases by 1 K starting from an operating temperature $T_0$, the voltage $U_H$ dropping across the associated section of the semiconductor body usually decreases by a value $\Delta U_H$. The current control element is preferably selected such that, during intended operation of the individual emitter, a resistance of the current control element is greater than $|\Delta U_H/I_0|$, preferably at least twice as great or at least five times as great or at least ten times as great or at least 20 times as great.

Alternatively or additionally, the current control element may be selected such that its resistance at the operating temperature $T_0$ comprises a positive temperature coefficient $dR_S/dT|_{T_0}$. In other words, the current control element is then a posistor or a PTC element. Preferably, the temperature coefficient $dR_S/dT|_{T_0}$ is:

$$dR_S/dT|_{T_0} \geq 0.5/I_0 \cdot dU_H/dT|_{T_0} \text{ or } dR_S/dT|_{T_0} \geq 0.75/I_0 \cdot dU_H/dT|_{T_0} \text{ or } dR_S/dT|_{T_0} \geq 0.85/I_0 \cdot dU_H/dT|_{T_0}$$

and/or $$dR_S/dT|_{T_0} \leq 2/I_0 \cdot dU_H/dT|_{T_0} \text{ or } dR_S/dT|_{T_0} \leq 1.5/I_0 \cdot dU_H/dT|_{T_0} \text{ or } dR_S/dT|_{T_0} \leq 1.2/I_0 \cdot dU_H/dT|_{T_0}.$$

In at least one embodiment, the diode laser comprises a laser bar, wherein the laser bar comprises a semiconductor body having an active layer for generating laser radiation, and wherein the laser bar comprises a plurality of individual emitters arranged side by side in a transverse direction, each of which emits laser radiation during intended operation. Further, the diode laser comprises one or more current control elements on the semiconductor body. At least some individual emitters are each assigned a section of the semiconductor body and a current control element connected in series therewith, so that in the intended operation of the individual emitters an electric operating current $I_0$ supplied to the individual emitter in each case flows completely through the assigned section of the semiconductor body and a voltage drop $U_H$ occurs at the section and at least part of this operating current $I_0$ flows through the assigned current control element and in the process experiences an electric resistance $R_S$. In the case of the individual emitters, the respective associated current control element is configured such that the resistance $R_S$ comprises a positive temperature coefficient $dR_S/dT|_{T_0}$ at an operating temperature $T_0$. Alternatively or additionally, the resistance $R_S$ is greater than $|\Delta U_H/I_0|$, wherein $\Delta U_H$ is the change in the voltage drop $U_H$ at the associated section of the semiconductor body when the temperature T of the individual emitter is increased from an operating temperature $T_0$ by 1 K.

In particular, the present invention is based on the following finding: the laser parameters of individual emitters, in particular of InGaN individual emitters, comprise a high fluctuation, even if only individual emitters from one wafer compound are considered. For devices containing only a single individual emitter, bad individual emitters are sorted out by measurement.

If the individual emitters are not operated individually, but in a bar compound, selection is no longer possible.

Therefore, there is always a certain variation of individual emitters on a laser bar. Since the individual emitters are usually electrically connected in parallel, the individual emitters are not operated with constant current, as recommended, but with constant voltage.

The forward voltage of the individual emitters is strongly dependent on various parameters, such as the temperature in the active layer and the quality of metal-semiconductor contacts. Thus, the forward voltage is significantly influenced by the laser parameters of the individual emitters. Consequently, a variation of the laser parameters over a laser bar leads to a sometimes dramatic non-uniformity of the current flow. This can even go so far as to cause an individual emitter to carry most of the current through the laser bar, overheat, and burn off. Subsequently, the same thing happens to the rest of the laser bar.

The inventors had, inter alia, the idea of homogenizing the current imprint in the laser bar, in the sense that each individual emitter of the laser bar carries about the same amount of current. For this purpose, a current control element is assigned to each of the individual emitters, which limits the current flow. By selecting the current control element, for example as a PTC thermistor, a reduction in the voltage drop in an individual emitter in the event of a temperature increase can be counteracted. On the other hand, in the case of a current control element which entails an already high resistance, temperature-related changes in the voltage drop across the section of the semiconductor body associated with the individual emitter lead to a reduced increase in current through the individual emitter.

According to at least one embodiment, in the intended operation of at least one individual emitter, preferably several or all individual emitters, the following applies to the resistance $R_S$ at the associated current control element:
a) $+0.1$ m$\Omega$/K$\leq dR_S/dT|_{T_0}+20$ m$\Omega$/K and/or
b) $0.5$ m$\Omega \leq R_S \leq 100$ m$\Omega$.

Preferably, the resistance $R_S$ at the operating temperature $T_0$ is $\geq 5$ m$\Omega$ or $\geq 10$ m$\Omega$ or $15$ m$\Omega$. Alternatively or additionally, the temperature coefficient $dR_S/dT|_{T_0}$ of the resistor RS is preferably $\geq 0.5$ m$\Omega$/K or $1$ m$\Omega$/K or $1.5$ m$\Omega$/K.

According to at least one embodiment, in at least one individual emitter, preferably in several or all individual emitters, the associated current control element comprises or consists of a ferroelectric material.

According to at least one embodiment, the ferroelectric material is a ferroelectric semiconductor ceramic. For example, the ferroelectric material is $Ba_{1-x}Sr_xTiO_3$. This material comprises a relatively low resistivity in the cold state. At a temperature above a Curie temperature $T_C$, the resistivity increases exponentially, for example by several orders of magnitude within $\Delta T \approx 15$ K.

According to at least one embodiment, for at least one individual emitter, preferably for several or all individual emitters, the associated current control element is a high-temperature superconductor, in particular a superconducting insulator. At high temperatures, for example above the operating temperature $T_0$, the material then loses its superconductivity, causing the resistance $R_S$ of the current control element to increase sharply.

It is possible for the current control element to comprise or consist of, in particular, a metal or a semiconductor material. Suitable materials for the current control element, especially if it is to be designed as a PTC element, include $BaTiO$, $BaCO$, $TiO_2$, Si, Pt, Au, Ag, Al, Mo, W, Ni, Fe, Pb, or a mixture of these materials. Also, the current control element may comprise or consist of Pd, Ti, Cr, or TCO.

According to at least one embodiment, the diode laser comprises several current control elements on the semiconductor body that are separated from each other, wherein several individual emitters are each assigned their own current control element, preferably uniquely or biuniquely assigned. The different current control elements are thereby preferably arranged next to one another in the transverse direction and are spaced apart from one another in the transverse direction, i.e. are not connected to each other. The current control elements may all be arranged on the same side of the semiconductor body.

According to at least one embodiment, during intended operation of at least one individual emitter, preferably several or all individual emitters, the part of the operating current $I_0$ flowing within the associated current control element flows predominantly in a direction transverse or perpendicular to a main extension plane of the semiconductor body. "Predominantly" means that a current path through the current control element travels a greater distance in a direction perpendicular or transverse to the main extension plane than in a direction parallel to the main extension plane. The thickness of the current control element, measured perpendicular to the main extension plane of the semiconductor body, must be chosen accordingly. In return, the lateral dimensions of the current control elements, measured along the main extension plane, can be chosen small. For example, the individual emitters can be arranged close to each other.

According to at least one embodiment, in the intended operation of at least one individual emitter, preferably several or all individual emitters, the part of the operating current $I_0$ flowing within the associated current control element flows predominantly in a direction parallel to a main extension plane of the semiconductor body. That is, the current path through the current control element covers a greater distance in the direction parallel to the main extension plane than in the direction perpendicular to the main extension plane. Preferably, the part of the operating current $I_0$ flows predominantly in the transverse direction.

For example, the main extension plane of the semiconductor body runs parallel to the active layer.

According to at least one embodiment, in the case of at least one individual emitter, preferably in the case of several or all individual emitters, the associated current control element is divided into several sections, wherein the different sections are each connected in series with the section of the semiconductor body associated with the individual emitter. The sections of the current control element are connected in parallel with each other. Furthermore, the sections of the current control element of the individual emitter are assigned to different areas of the semiconductor body. Resistors $R_{SA}$, $R_{SB}$ of different sections comprise different temperature coefficients $dR_{SA}/dT|_{T_0}$, $dR_{SB}/dT|_{T_0}$ at the operating temperature $T_0$. For example, the temperature coefficient $dR_{SA}/dT|_{T_0}$ of the resistor $R_{SA}$ of a first section is at least twice as large or at least ten times as large as the temperature coefficient $dR_{SB}/dT|_{T_0}$ of the resistor $R_{SB}$ of a second section.

The different sections of the current control element are preferably formed of different materials. At high temperatures, different/more favorable regions of the individual emitter are then energized than at low temperatures. Furthermore, in this way, the area energized can be reduced at high temperatures, which increases the series resistance, increases the forward voltage of the diode, and consequently decreases the current through the individual emitter.

For example, the different sections can be strips adjacent to each other in the transverse direction. Also, the different sections may form a checkerboard pattern when viewed from above the semiconductor body. The different sections may also be arranged in succession in a direction perpendicular to the main extension plane of the semiconductor body.

According to at least one embodiment, the laser bar comprises a plurality of first contact elements arranged on the semiconductor body. Each individual emitter is preferably uniquely assigned its own first contact element. The associated individual emitters can be contacted via the first contact elements. The first contact elements preferably are not connected to teach other and are, for example, spaced apart from one another in the transverse direction. The first contact elements may in particular comprise a metal, such as gold. The first contact elements may be solder pads or bond pads.

The first contact elements may all be arranged on the same side of the semiconductor body, for example on the p-side. The first contact elements are then all p-side contact elements. The current control element or elements may be arranged on the same side of the semiconductor body as the first contact elements or on the opposite side. For example, the current control element is formed between the first contact elements and the semiconductor body or on the side of the first contact elements facing away from the semiconductor body.

According to at least one embodiment, in the case of at least one individual emitter, preferably in the case of several or all individual emitters, a length of the associated first contact element, measured along a longitudinal direction extending perpendicular to the transverse direction, is greater than a length of the current control element associated with the individual emitter. In particular, the longitudinal direction is a direction perpendicular to the transverse direction and parallel to the main extension plane of the semiconductor body. For example, the length of the first contact element is at least 1.5 times or at least twice the length of the current control element. In particular, in this case the current control element may be retracted from the facets of the laser bar, which may be advantageous for the fabrication of the diode laser.

Alternatively, however, it is also conceivable that in the case of one individual emitter or in the case of several or all individual emitters, a length of the associated first contact element substantially corresponds to a length of the current control element associated with the individual emitter. For example, the lengths of the first contact element and the current control element then deviate from each other by at most 20% or at most 10%.

According to at least one embodiment, in at least one individual emitter, preferably in several or all individual emitters, the associated current control element is a contact wire. The part of the operating current $I_0$ then flows through the contact wire along its length during operation.

According to at least one embodiment, in the case of at least one individual emitter, preferably in the case of several or all individual emitters, the associated current control element is formed integrally and/or in a simply connected manner.

According to at least one embodiment, the diode laser further comprises a heat sink to which the laser bar is applied, for example soldered. In particular, the laser bar is applied to the heat sink with the p-side of the semiconductor body leading. For example, the laser bar is soldered onto the heat sink via the first contact elements. The heat sink may comprise or consist of metal or ceramic or a metal-ceramic layered structure. For example, the heat sink comprises or consists of: SiC, AlN, Cu, CuW. For example, the heat sink comprises a DCB (Direct Copper Bond) structure, for example comprising an AlN or SiC layer between two copper layers.

According to at least one embodiment, in at least one individual emitter, preferably in several or all individual emitters, the associated current control element is applied to the side of the semiconductor body facing away from the heat sink.

According to at least one embodiment, in at least one individual emitter, preferably in several or all individual emitters, the associated current control element is formed on the side of the semiconductor body facing the heat sink. In particular, in this case the heat sink itself may be the current control element.

For example, the diode laser may be actively or passively cooled. The diode laser may be provided in a C-mount package or a TO-mount package or a CS-mount package. The diode laser may include a microchannel cooler (MCC). The diode laser may be cooled from one side, two sides, three sides four sides, or five sides.

Next, a method for operating a diode laser is specified. The method is particularly suitable for operating a diode laser as described herein. All features disclosed in connection with the diode laser are therefore also disclosed for the method, and vice versa.

According to at least one embodiment, the method is used to operate a diode laser according to at least one of the previously described embodiments. The individual emitters are operated in a parallel circuit. Thereby, an operating current $I_0$ flows through each individual emitter, whereby laser radiation is generated in the individual emitters. The operating currents $I_0$ of different individual emitters can differ. In each of the individual emitters, a part of the operating current $I_0$ flows through the current control element associated with the individual emitter.

According to at least one embodiment of the method, in at least one individual emitter, preferably in several or all individual emitters, the entire operating current $I_0$ flows through the associated current control element.

BRIEF DESCRIPTION OF THE DRAWINGS

In the following, a diode laser described herein as well as a method for operating a diode laser described herein are explained in more detail with reference to drawings by means of exemplary embodiments. Identical reference signs thereby specify identical elements in the individual figures. However, no references to scale are shown; rather, individual elements may be shown exaggeratedly large for better understanding.

Showing in:

FIGS. 1A, 1B and 3 to 11 various exemplary embodiments of a diode laser in different views, FIGS. 2A to 2D various exemplary embodiments of a current control element in perspective view.

DETAILED DESCRIPTION

Figure 1A:
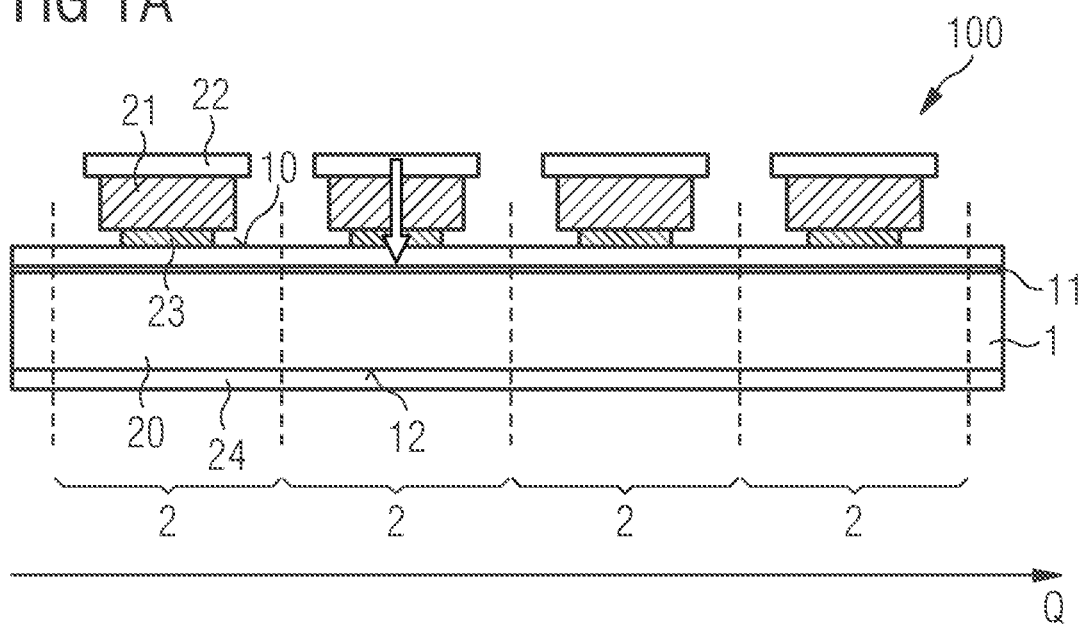

In FIG. 1A, a first exemplary embodiment of a diode laser 100 is shown in a top view of a facet of the diode laser. The diode laser 100 comprises a semiconductor body 1 having an active layer 11. Electromagnetic radiation is generated in the active layer 11 during intended operation. The semiconductor body 1 is based, for example, on InGaN.

The semiconductor body 1 comprises a first main side 10 and a second main side 12 opposite to the first main side 10. The main sides are top surfaces of the semiconductor body 1. The first main side 10 is, for example, a p-side of the semiconductor body 1. That is, holes are injected into the semiconductor body 1 via the first main side 10 during intended operation of the diode laser 100. The second main side 12 may correspondingly be the n side via which electrons are injected into the semiconductor body 1 during operation.

A plurality of metallizations 23, a plurality of current control elements 21, and a plurality of first contact elements 22 are arranged on the first main side 10 of the semiconductor body 1. Presently, the current control elements 21 are respectively arranged between the first contact elements 22 and the metallizations 23. For example, the metallizations 23 are directly adjacent to the semiconductor body 1 and serve to inject charge carriers into the semiconductor body 1. For example, the metallizations 23 are based on or consist of palladium. The first contact elements 22 may be solder contact elements, for example made of gold.

The current control elements 21 are based, for example, on platinum or a ferroelectric semiconductor ceramic or a superconducting insulator.

A second contact element 24 is arranged on the second main side 12 of the semiconductor body 1. For example, the second contact element 24 is formed in a simply connected manner. For example, the second contact element 24 comprises Au and/or Ti and/or Pt.

Presently, the diode laser 100 is a laser bar having a plurality of individual emitters 2 arranged side by side in a transverse direction Q. Each individual emitter 2 is associated with a separate section 20 of the semiconductor body 1. Furthermore, a first contact element 22, a current control element 21 and a metallization 23 are biuniquely associated with each individual emitter 2. Furthermore, a section of the second contact element 24 is associated with each individual emitter 2.

In the intended operation of an individual emitter 2, an operating current $I_0$ flows through the associated first contact element 22, the associated metallization 23, the associated section 20 of the semiconductor body 1 and the associated section of the second contact element 24, respectively. At least part of the operating current $I_0$ flows through the associated current control element 21. The operating current $I_0$ for an individual emitter 2 is indicated as a black arrow. For example, the operating current $I_0$ is 2 A. At this operating current $I_0$, the operated individual emitter 2 comprises, for example, an operating temperature $T_0$ of 350 K.

The current control elements 21 can now each be selected such that their resistance $R_S$ is greater than $|\Delta U_H/I_0|$ for the part of the operating current $I_0$ flowing through them, wherein $\Delta U_H$ is the change in the voltage drop $U_H$ at the associated section 20 of the semiconductor body 1 when the temperature T of the individual emitter 2 is increased by 1 K starting from the operating temperature $T_0$. Alternatively or additionally, the resistances $R_S$ of the current control elements 21 may each comprise a positive temperature coefficient $dR_S/dT|_{T_0}$ at an operating temperature $T_0$.

This embodiment of the current control elements 21 achieves homogenization of the current injected into the individual emitters 2 during intended operation, in which the individual emitters 2 are preferably operated in parallel.

Figure 1B:
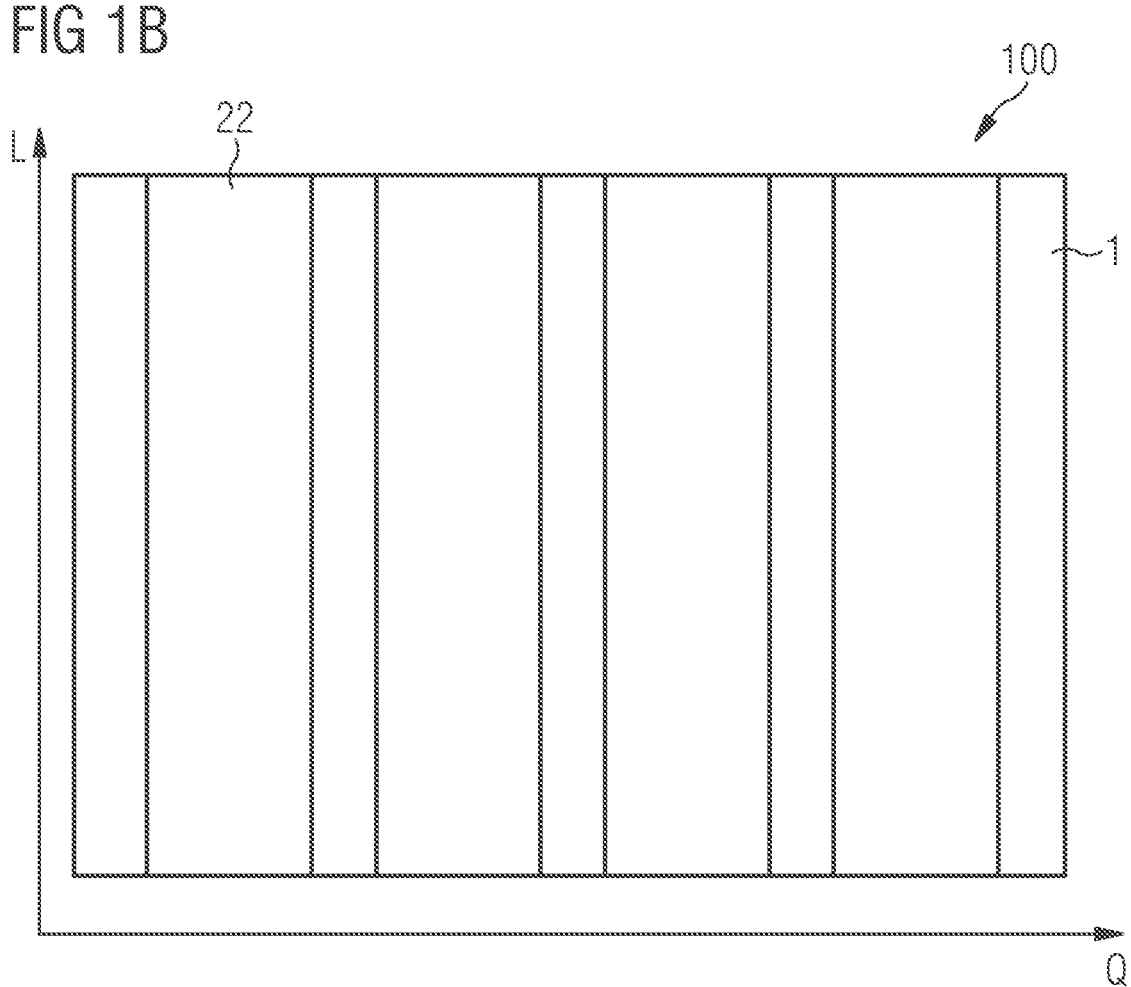

In FIG. 1B, a top view of the first main side 10 is shown. The first contact elements 22 are elongated formed. Their length, measured along a longitudinal direction L, is greater than their width, measured along the transverse direction Q.

In the top view shown in FIG. 1B, the first contact elements 22 completely cover the current control elements 21 and the metallizations 23. The lengths of the current control elements 21 and the metallizations 23 may each be substantially equal to the length of the first contact elements 22.

FIGS. 2A to 2D show various exemplary embodiments of a current control element 21. Such current control elements 21 may be used in the previously shown exemplary embodiment of a diode laser 100 and in the following exemplary embodiments of a diode laser 100.

Figure 2A:
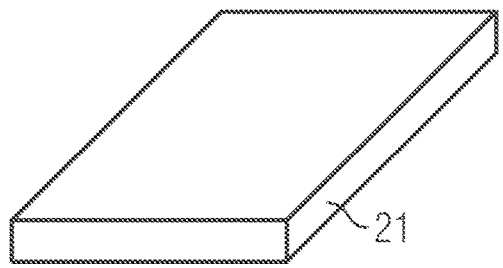

In FIG. 2A, the current control element 21 is a one-piece element.

Figure 2B:
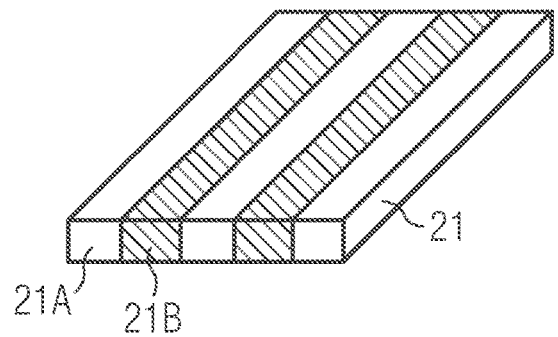

In FIG. 2B, the current control element 21 comprises different sections 21A, 21B alternately arranged side by side. A first section 21A comprises, for example, a resistor $R_{SA}$. A second section 21B comprises, for example, a resistor $R_{SB}$. The resistor $R_{SA}$ comprises, for example, a temperature coefficient $dR_{SA}/dT|_{T_0}$ at the operating temperature $T_0$. For example, the resistor $R_{SB}$ comprises a temperature coefficient $dR_{SB}/dT|_{T_0}$ at the operating temperature $T_0$. For example, $dR_{SA}/dT|_{T_0}$ is greater than $dR_{SB}/dT|_{T_0}$. For example, sections 21A, 21B are made of different materials. The resistances $R_{SA}$, $R_{SB}$ refer to the case of current flow through the sections 21A, 21B perpendicular to the main extension plane of the current control element 21.

With such a current control element 21, different regions of the section 20 of the semiconductor body 1 associated with an individual emitter 2 can be energized to different degrees at different temperatures.

Figure 2C:
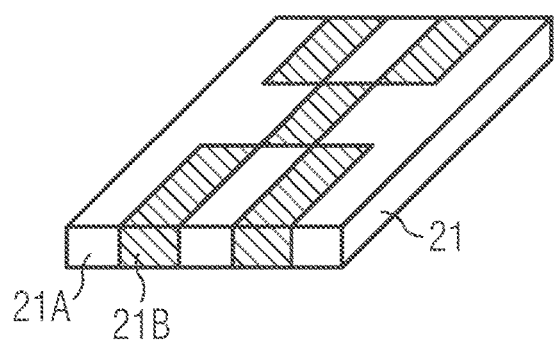

In FIG. 2C, the current control element 21 again comprises different sections 21A, 21B arranged in a checkerboard pattern. In terms of materials and properties, these sections may also be selected as the sections of FIG. 2B.

Figure 2D:
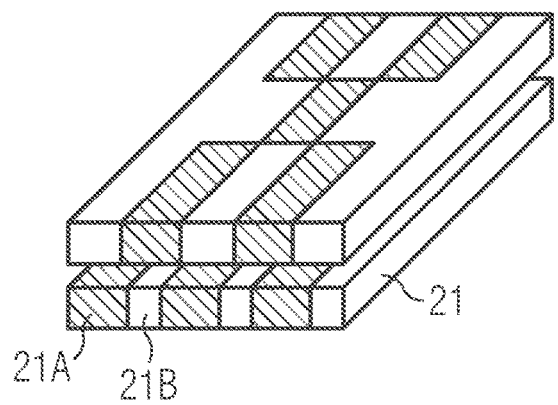

In FIG. 2D, the current control element 21 comprises various sections 21A, 21B which are juxtaposed not only in a plane parallel to a main extension plane of the current control element 21, but also in a direction perpendicular thereto.

FIG. 3 shows a second exemplary embodiment of a diode laser 100. Unlike the exemplary embodiment of FIG. 1, a current flows through the current control element 21 predominantly in the transverse direction Q. As a result, a smaller thickness can be selected for the current control element 21 than in the exemplary embodiment of FIG. 1. In order to achieve a predominant current flow in the transverse direction Q, an insulation 25, for example of silicon nitride or silicon oxide or aluminum oxide, is also provided between the current control element 21 and the semiconductor body 1.

In the third exemplary embodiment of FIG. 4, again in the intended operation of an individual emitter 2, the current flows predominantly in the transverse direction Q through the associated current control element 21. In this case, however, two first contact elements 22 are associated with each individual emitter 2, which are separated from one another in the transverse direction Q by an insulation 25. With the embodiment shown in FIG. 4, a two-dimensional contacting of the individual emitters 2 can be established in a simplified manner.

Figure 5:
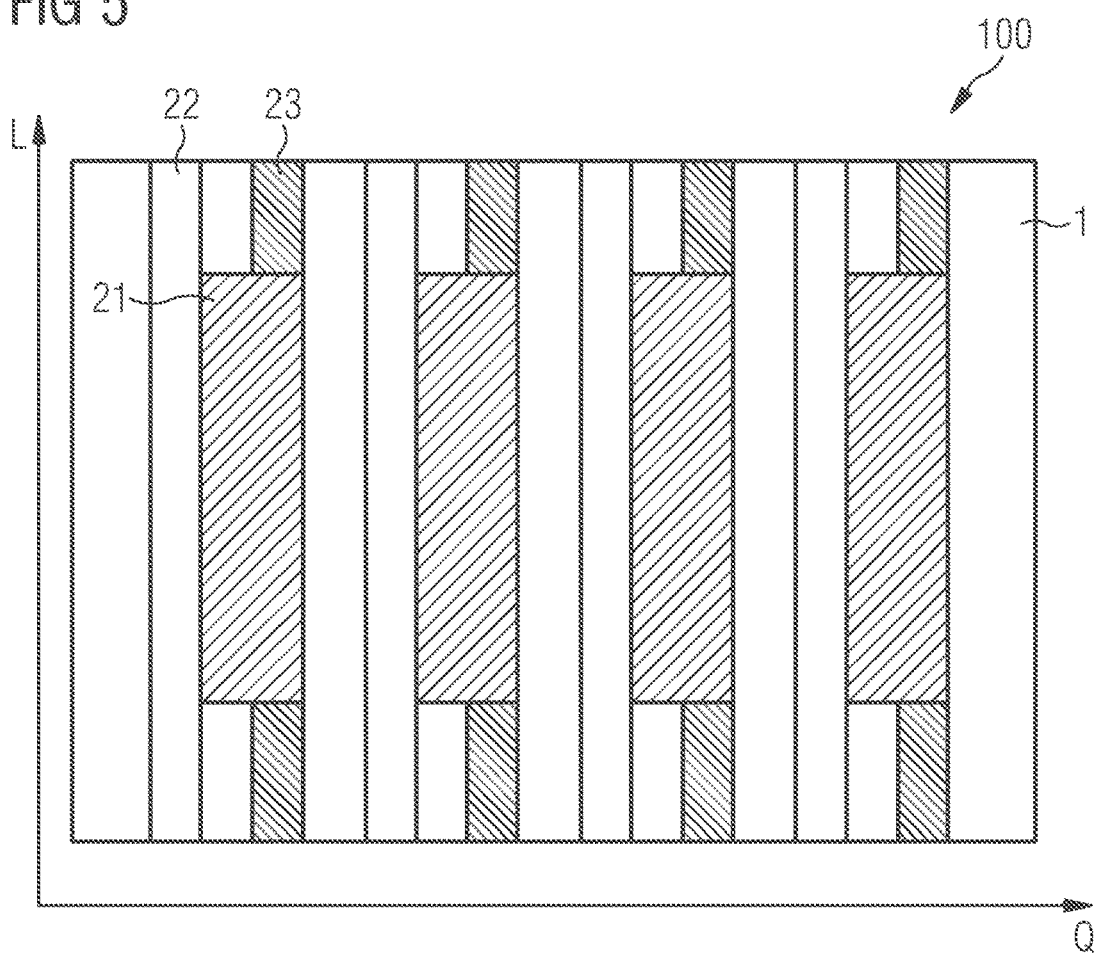

In FIG. 5, a fourth exemplary embodiment of a diode laser 100 is shown in top view of the first main side 10 of the semiconductor body 1. The current control elements 21 comprise a shorter length than the associated first contact elements 22 and the associated metallizations 23, respectively. In particular, the current control elements 21 are each retracted from the facets of the semiconductor body 1 opposite to each other in the longitudinal direction L.

This can have an advantageous effect in the manufacture of the diode laser 100. Otherwise, the exemplary embodiment of FIG. 5 is substantially the same as the exemplary embodiment of FIG. 3.

Figure 6:
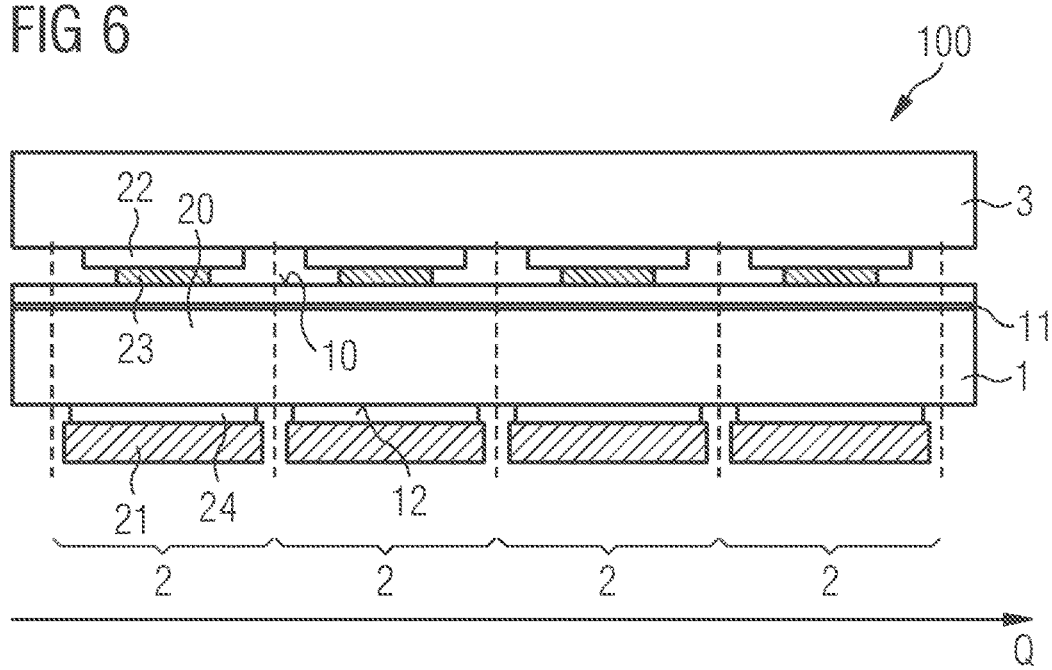

In FIG. 6, a fifth exemplary embodiment of a diode laser 100 is shown. In this case, each individual emitter 2 is associated with its own second contact element 24 on the second main side 12. The individual second contact elements 24 are spaced apart from each other and are not connected.

Furthermore, in the FIG. 6 the current control elements 21 are formed on the sides of the second contact elements 24 facing away from the semiconductor body 1.

In addition to the laser bar, the diode laser 100 of FIG. 6 further comprises a heat sink 3 arranged on the first main side 10 of the semiconductor body 1. For example, the first contact elements 22 are soldered to the heat sink 3. The heat sink 3 may comprise or consist of SiC, AlN, Cu, CuW, for example.

Such a heat sink 3 may also be used in the previously shown exemplary embodiments.

Figure 7:
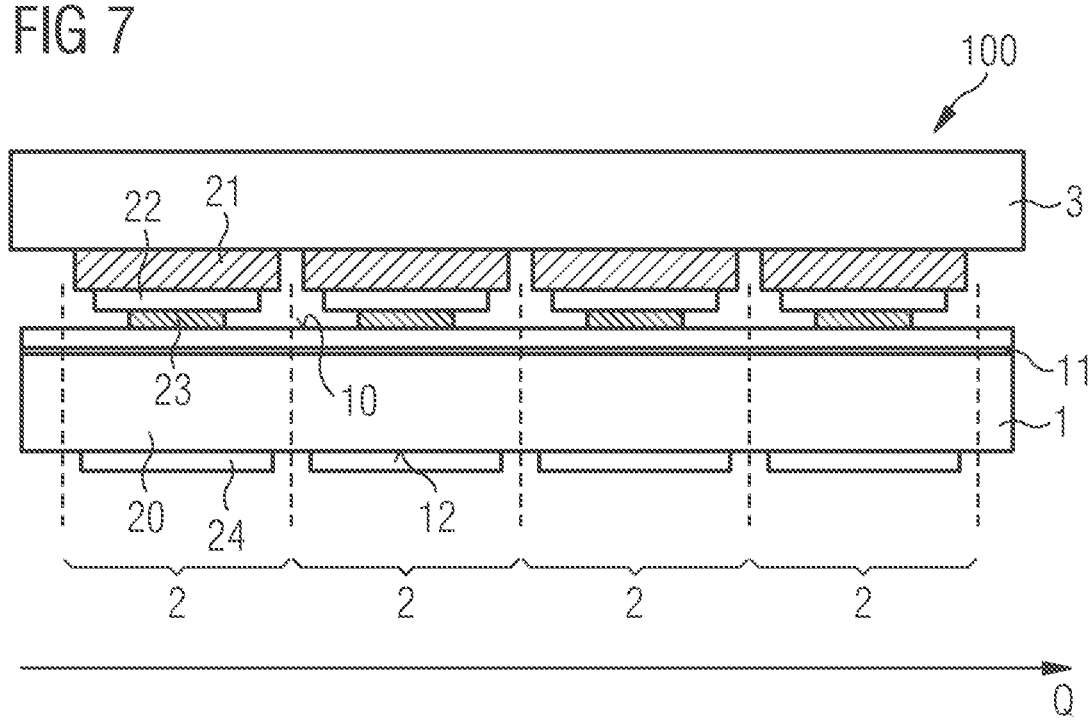

In the sixth exemplary embodiment of FIG. 7, as in the exemplary embodiment of FIG. 6, the individual emitters 2 are each associated with their own second contact element 24 on the second main side 12. The current control elements 21 are formed on the sides of the first contact elements 22 facing away from the semiconductor body 1 between the heat sink 3 and the first contact elements 22.

Figure 8:
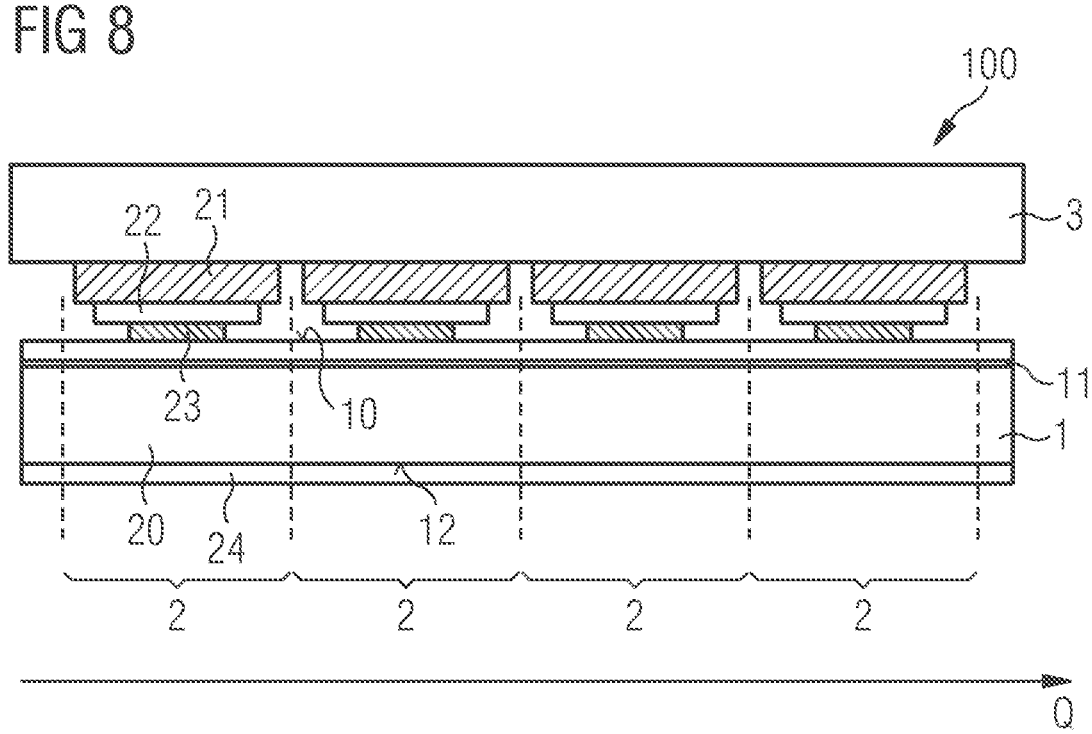

FIG. 8 shows a seventh exemplary embodiment of a diode laser 100. The current control elements 21 are again arranged between the first contact elements 22 and the heat sink 3. The individual emitters 2 share a common second contact element 24 on the second main side 12.

FIG. 9 shows an eighth exemplary embodiment of a diode laser 100. Again, a heat sink 3 is formed on the first main side 10 of the semiconductor body 1. In the present embodiment, the diode laser 100 comprises only a single current control element 21 which, when viewed from above, overlaps with all of the individual emitters 2. Thus, the same current control element 21 is associated with each of the individual emitters 2. However, the different individual emitters 2 are each assigned different sections of the current control element 21. The current control element 21 is, for example, simply connected and can be formed in one piece. Preferably, the current control element 21 is segmented so that each individual emitter 2 of the laser bar can be more selectively controlled. For example, the current control element 21 may have been first applied to the heat sink 3 and then soldered to the first contact elements 22 of the laser bar.

In FIG. 10, a ninth exemplary embodiment of the diode laser 100 is shown. Here, the current control elements 21 are formed by contact wires which are connected to the second contact elements 24 of the individual emitters 2. Via the contact wires 21, the individual emitters 2 are supplied with current during intended operation. A heat sink 3 can also be used here.

Figure 11:
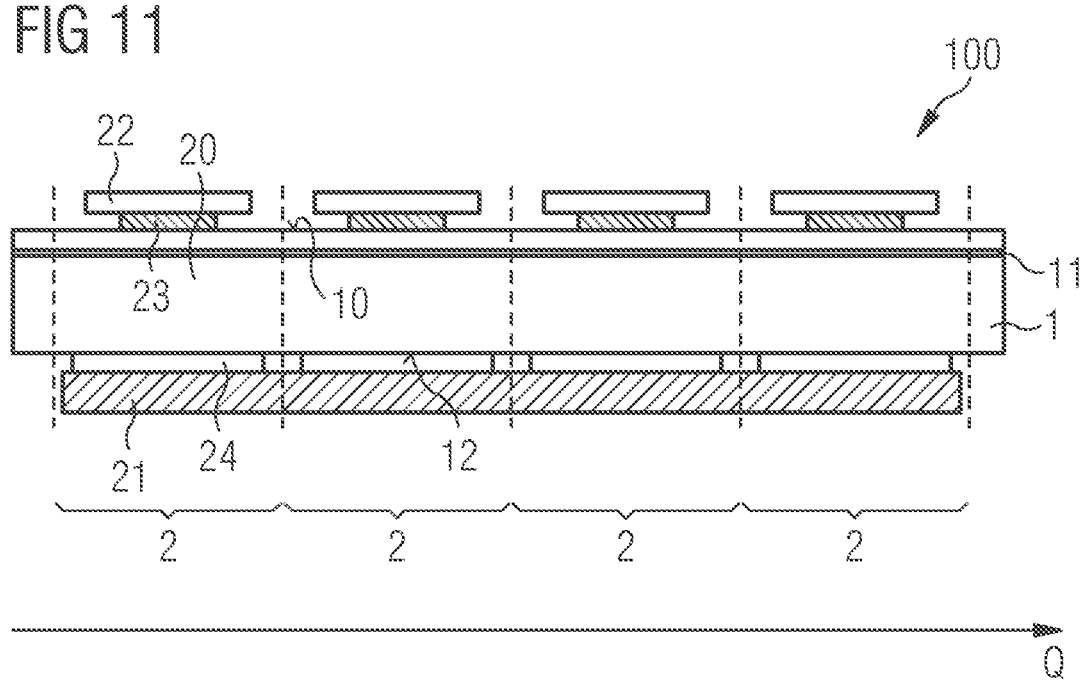

FIG. 11 shows a tenth exemplary embodiment of a diode laser 100. Again, only a single current control element 21 is provided. For example, the current control element 21 is formed in a simply connected manner and may additionally be formed in a single piece. The current control element 21 is arranged on the second contact elements 24. The current control element 21 may, for example, be a metal sheet. To maximize the effectiveness of the current control element 21, the current control element 21 may be segmented.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. A diode laser comprising:
   a laser bar, wherein the laser bar comprises a semiconductor body having an active layer for generating laser radiation, and wherein the laser bar comprises a plurality of individual emitters arranged side by side in a transverse direction, each of which emits laser radiation in the intended operation,
   one or more current control elements on the semiconductor body, wherein
   at least some of the plurality of individual emitters are each assigned a section of the semiconductor body and a current control element connected in series therewith, so that, in the intended operation of the at least some of the plurality of individual emitters, in each case an operating current $I_O$ supplied to the individual emitter flows completely through the associated section of the semiconductor body and, in the process, a voltage drop $U_H$ occurs at the section and at least part of this operating current $I_O$ flows through the associated current control element and, in the process, experiences an electrical resistance $R_S$,
   in the at least some of the plurality of individual emitters, the respectively associated current control element is configured in such a way that the resistance $R_S$,
   a) comprises a positive temperature coefficient $dR_S/dT|_{T0}$ at an operating temperature $T_O$ and $dR_S/dT|_{T0} \geq 0.5/I_O \cdot dU_H/dT|_{T0}$ and/or
   b) is greater than $|\Delta U_H/I_O|$, wherein $\Delta U_H$ is the change in the voltage drop $U_H$ at the associated section of the semiconductor body when the temperature T of the individual emitter is increased from an operating temperature $T_O$ by 1 K.

2. The diode laser according to claim 1,
   wherein, in the intended operation of at least one individual emitter of the at least some of the plurality of individual emitters, the following applies to the resistance $R_S$ of the associated current control element:
   a) $+0.1$ m$\Omega$/K $\leq dR_S/dT|_{T0} \leq +20$ m$\Omega$/K and/or
   b) $0.5$ m$\Omega \leq R_S \leq 100$ m$\Omega$.

3. The diode laser according to claim 1,
   wherein, for at least one individual emitter of the at least some of the plurality of individual emitters, the associated current control element comprises or consists of a ferroelectric material.

4. The diode laser according to claim 3,
   wherein the ferroelectric material is a ferroelectric semiconducting ceramic.

5. The diode laser according to claim 1,
   wherein, for at least one individual emitter of the at least some of the plurality of individual emitters, the associated current control element is a high temperature superconductor.

6. The diode laser according to claim 1,
   wherein the diode laser comprises a plurality of mutually separate current control elements on the semiconductor body, wherein the plurality of individual emitters are each assigned their own current control element.

7. The diode laser according to claim 1,
   wherein, in the intended operation of at least one individual emitter of the at least some of the plurality of individual emitters, the part of the operating current $I_O$ flowing within the associated current control element flows predominantly in a direction transverse or perpendicular to a main extension plane of the semiconductor body.

8. The diode laser according to claim 1,
   wherein, in the intended operation of at least one individual emitter of the at least some of the plurality of individual emitters, the part of the operating current $I_O$ flowing within the associated current control element flows predominantly in a direction parallel to a main extension plane of the semiconductor body.

9. The diode laser according to claim 1,
   wherein, in at least one individual emitter of the plurality of individual emitters, the associated current control element is divided into a plurality of sections each being connected in series with the section of the semiconductor body associated with the individual emitter, wherein the sections of the current control element are connected in parallel with each other, the sections of the current control element of the plurality of individual emitters are assigned to different regions of the semiconductor body, resistances $R_{SA}$, $R_{SB}$ of different sections comprise different temperature coefficients $dR_{SA}/dT|_{T0}$, $dR_{SB}/dT|_{T0}$ at the operating temperature $T_0$.

10. The diode laser according to claim 1, wherein
the laser bar comprises a plurality of first contact elements arranged on the semiconductor body,
each individual emitter is unambiguously assigned its own first contact element
the associated individual emitters is contacted via the first contact elements.

11. The diode laser according to claim 1,
wherein, in at least one individual emitter of the plurality of individual emitters, a length of the associated first contact element, measured along a longitudinal direction running perpendicular to the transverse direction, is greater than a length of the current control element associated with the at least one individual emitter.

12. The diode laser according to claim 1,
wherein, in at least one individual emitter of the plurality of individual emitters, the associated current control element is a contact wire.

13. The diode laser according to claim 1,
wherein, in at least one individual emitter of the plurality of individual emitters, the associated current control element is integrally and/or singly coherently formed.

14. The diode laser according to claim 1,
further comprising a heat sink to which the laser bar is applied.

15. The diode laser according to claim 14,
wherein, for at least one individual emitter of the plurality of individual emitters, the associated current control element is applied to the side of the semiconductor body applied to the heat sink.

16. The diode laser according to claim 14,
wherein, in at least one individual emitter of the plurality of individual emitters, the associated current control element is formed on the side of the semiconductor body facing the heat sink.

17. A method for operating a diode laser according to claim 1, wherein
the at least some of the individual emitters of the plurality of individual emitters are operated in a parallel circuit,
an operating current $I_0$ flows through each individual emitter of the at least some of the individual emitters of the plurality of individual emitters and laser radiation is thereby generated in the individual emitters, and
in each of the individual emitters at least part of the operating current $I_0$ flows through the associated current control element.

18. The method according to claim 17,
wherein in at least one individual emitter of the plurality of individual emitters the entire operating current $I_0$ flows through the associated current control element.

19. A diode laser comprising:
a laser bar, wherein the laser bar comprises a semiconductor body having an active layer for generating laser radiation, and wherein the laser bar comprises a plurality of individual emitters arranged side by side in a transverse direction, each of which emits laser radiation in the intended operation,
one or more current control elements on the semiconductor body, wherein
at least some of the plurality of individual emitters are each assigned a section of the semiconductor body and a current control element connected in series therewith, so that, in the intended operation of the at least some of the plurality of individual emitters, in each case an operating current $I_0$ supplied to the individual emitter flows completely through the associated section of the semiconductor body and, in the process, a voltage drop $U_H$ occurs at the section and at least part of this operating current $I_0$ flows through the associated current control element and, in the process, experiences an electrical resistance $R_S$,
in the at least some of the plurality of individual emitters, the respectively associated current control element is configured in such a way that the resistance $R_S$,
a) comprises a positive temperature coefficient $dR_S/dT|_{T0}$ at an operating temperature $T_0$ and/or
b) is greater than $|\Delta U_H/I_0|$, wherein $\Delta U_H$ is the change in the voltage drop $U_H$ at the associated section of the semiconductor body when the temperature T of the individual emitter is increased from an operating temperature $T_0$ by 1 K, wherein
the diode laser comprises at least one of the following features:
in the intended operation of at least one individual emitter, the following applies to the resistance $R_S$ of the associated current control element:
a) $+0.1$ m$\Omega$/K$\leq dR_S/dT|_{T0}\leq +20$ m$\Omega$/K and/or b) $0.5$ m$\Omega \leq R_S \leq 100$ m$\Omega$,
for at least one individual emitter of at least some of the individual emitters of the plurality of individual emitters, the associated current control element comprises or consists of a ferroelectric material,
for the at least one individual emitter, the associated current control element is a high temperature superconductor,
the diode laser comprises a plurality of mutually separate current control elements on the semiconductor body, wherein the plurality of individual emitters are each assigned their own current control element,
for the at least one individual emitter, the associated current control element is divided into a plurality of sections each being connected in series with the section of the semiconductor body associated with the at least one individual emitter, wherein
the sections of the current control element are connected in parallel with each other,
the sections of the current control element of the at least one individual emitter are assigned to different regions of the semiconductor body,
resistances $R_{SA}$, $R_{SB}$ of different sections comprise different temperature coefficients $dR_{SA}/dT|_{T0}$, $dR_{SB}/dT|_{T0}$ at the operating temperature $T_0$, or
for the at least one individual emitter, the associated current control element is a contact wire.

* * * * *